United States Patent [19]
Pribat et al.

[11] Patent Number: 5,356,510
[45] Date of Patent: Oct. 18, 1994

[54] METHOD FOR THE GROWING OF HETEROEPITAXIAL LAYERS

[75] Inventors: Daniel Pribat, Sevres; Bruno Gerard, Chelles; Pierre Legagneux, Le Mesnil St Denis, all of France

[73] Assignee: Thomson-CSF, Puteaux, France

[21] Appl. No.: 956,995

[22] Filed: Oct. 6, 1992

[30] Foreign Application Priority Data

Oct. 8, 1991 [FR] France ................. 91 12352

[51] Int. Cl.$^5$ ........................... H01L 25/02
[52] U.S. Cl. ........................ 117/95; 437/83; 437/89; 437/90
[58] Field of Search .............. 156/613, 601; 437/81, 437/89, 90, 83, 84

[56] References Cited

U.S. PATENT DOCUMENTS

| | | | |
|---|---|---|---|
| 4,507,158 | 3/1985 | Kamins et al. | 437/89 |
| 4,578,142 | 3/1986 | Corboy, Jr. et al. | 437/89 |
| 4,615,762 | 10/1982 | Jastrzebski et al. | 437/89 |
| 4,663,831 | 5/1987 | Birrittella et al. | 437/89 |
| 4,786,615 | 11/1988 | Liaw et al. | 437/89 |
| 4,923,826 | 5/1990 | Jastrzebski et al. | 437/89 |
| 5,057,452 | 10/1991 | Theunissen et al. | 437/89 |

FOREIGN PATENT DOCUMENTS

| | | | |
|---|---|---|---|
| 380815 | 8/1990 | European Pat. Off. | |
| 63-174308 | 7/1988 | Japan | 437/89 |
| 4125920 | 4/1992 | Japan | 437/89 |

Primary Examiner—R. Bruce Breneman
Assistant Examiner—Ramamohan Rao Paladugu
Attorney, Agent, or Firm—Oblon, Spivak, McClelland, Maier & Neustadt

[57] ABSTRACT

A method according to which a layer of a semiconductor material is made on a substrate by growth in a confinement space defined by this substrate and by a confinement layer, this growth being achieved from a seed. The cross-section of the seed, substantially perpendicular to the general direction of growth, possesses a thick central part framed by two thinned lateral parts. The confinement space has the same cross-section as the seed.

10 Claims, 7 Drawing Sheets

METHOD FOR THE GROWING OF HETEROEPITAXIAL LAYERS

BACKGROUND OF THE INVENTION

1. Field of the Invention

The invention relates to a method for the making of heteroepitaxial layers, and more specifically to a method for making of at least one thin layer of a semiconductor material of one type on a semiconductor substrate of a different type.

The invention relates to the field of "thin layers" and particularly to the field of monocrystalline thin layers epitaxially grown on a substrate of a different nature.

The invention shall be applied, for example, to the growth of GaAs or InP layers on Si, and can be used for the elimination, by blocking, of the dislocations generated at the crystal/substrate substrate.

2. Description of the Prior Art

During the heteroepitaxial growth of GaAs on Si, dislocations are generated at the crystal/substrate interface and get propagated in the thin layer during the deposition. Very schematically, the presence of these dislocations is due both to the difference between the lattice parameters of Si (0.54 nm) and GaAs (0.56 nm) and to the difference between the heat expansion coefficients (2.3 $10^{-6°}$ C.$^{-1}$ for Si as compared with 5.6 $10^{-10°}$ C.$^{-1}$ for GaAs).

These dislocations, once nucleated, are practically impossible to eliminate during a normal MBE or MOCVD type growth, which considerably limits the field of application of the heteroepitaxial processes of GaAs on Si.

For, the dislocations acting as recombination centers, drastically reduce the lifetime of the minority carriers. The result thereof is that it is practically impossible to make bipolar type components, such as lasers and photodiodes in heteroepitaxially grown layers of GaAs on Si.

A method for blocking of the dislocations has been devised (cf. the French patent No. 88 044 38) filed on 5Apr. 1988). This method can be used to obtain layers practically free of defects. The principle of this method (known as a method of forced growth) is shown in FIG. 1. One of the drawbacks of the method is that it calls for the use of two dielectric levels and two masking levels to make, firstly, the seeding bands and, secondly, the bands enabling the access of the gas of the forced epitaxy phase (see FIG. 1).

The method described in the French patent application No. 90 12 443 makes it possible to provide for only one masking level. FIGS. 2a to 2f show a manufacturing method described in this patent application. This method is used, for example, to make a monocrystalline layer of GaAs on silicon without defects. First of all, therefore, a layer 2 of GaAs is made on the silicon substrate (FIG. 2a).

A layer of GaAs is covered with a layer 3 of $Si_3N_4$ (FIG. 2b). Apertures 4 are etched in the GaAs layer (FIG. 2c). Through these apertures, a selective chemical etching operation is carried out on the GaAs until all that is left is a seed 20 of GaAs shown in hatched lines in FIG. 2d. Finally, GaAs is made to grow by vapor phase epitaxy from the GaAs seed between the silicon substrate and the $Si_3N_4$ (FIGS. 3e and 3f). The dislocations are blocked on the substrate or on the layer of $Si_3N_4$ (FIG. 3f).

According to one variant of the method described in the U.S. patent application Ser. No. 90 12 443, after the making of the layer 2 of GaAs, bands 8 (FIG. 3) are etched and then the entire piece is covered with a layer 3 of $Si_3N_4$ (FIG. 4). Then bands 9 are etched in the layer 3, perpendicularly to the preceding bands 8 (FIG. 5).

Through the apertures 6, made by means of the etching in bands 9, the GaAs is subjected to selective etching until seeds 20 (FIG. 5) are left. Finally, the vapor phase epitaxy of GaAs is carried out, and there are obtained blocks of GaAs on silicon (FIG. 6), the dimensions of which can be predetermined when the etched bands 8 and 9 are being made.

This method thus makes it possible to achieve growths with semiconductors of different natures and to obtain heteroepitaxial structures in which the different layers are nevertheless crystalline and have neither dislocations nor defect planes. Furthermore, this method enables the reducing of the cooling constraints due to the differences in heat expansion coefficients between GaAs and Si.

This method provides for the use of the surface of the original substrate as one of the confinement surfaces of the directed lateral growth. The technique is thereby greatly simplified, for it requires no more than the implementation of a single deposition step (the deposition of an upper layer of $Si_3N_4$) and of a single step of selective epitaxy (the step of forced growth itself).

However, in this method, problems may appear during the vapor phase growth, especially when one of the directions yy' or xx' (FIG. 5) corresponds to a <011> type crystallographic direction of the plane (100) of the substrate. Indeed, the appearance of lateral facets is observed, and these facets prevent the growth from occurring normally.

FIG. 7 illustrates this situation in a top view. The seeding bands 20 are oriented along the direction <011> of the plane (100) of the substrate, and the facets appearing after growth are shown with their indices in FIG. 7. The phenomenon is inconvenient for it makes it difficult to obtain rectangular blocks after growth.

It is an object of the present invention to overcome this drawback.

SUMMARY OF THE INVENTION

The invention therefore relates to a method for the manufacture, by vapor phase growth on a substrate made of a semiconductor material of a first type, of a monocrystalline thin layer made of a semiconductor material of a second type, according to which the growth is initiated on at least one seed with a chemical composition identical to that of the second type of semiconductor material of the thin layer to be obtained, and is confined in a space defined by a face of the substrate itself and a confinement layer made of a material different from the semiconductor material of the second type in such a way that there can be neither nucleation nor deposition of semiconductor material whether on this confinement layer or on said face of the substrate, wherein the cross-section of the seed substantially perpendicular to the general direction of growth possesses a thick central part and two thinned lateral parts and wherein the space defined by the substrate and the confinement layer has a cross-section with a same profile as that of the seed.

BRIEF DESCRIPTION OF THE DRAWINGS

The different objects and features of the invention shall appear more clearly from the following description and from the appended figures, of which.

MORE DETAILED DESCRIPTION

The invention shall be described with reference to the example of GaAs heteroepitaxially grown on Si, but its framework of application is far broader. Indeed it is enough to be able to apply the present method to the case of the heteroepitaxial growth of a material A on a material B, to use a method of deposition enabling the elimination (at least temporarily) of the nucleation of A on B or to provide for a material B on which there can be neither nucleation nor deposition of the material A.

The invention will be understood more clearly from the following description.

Figure 8A:
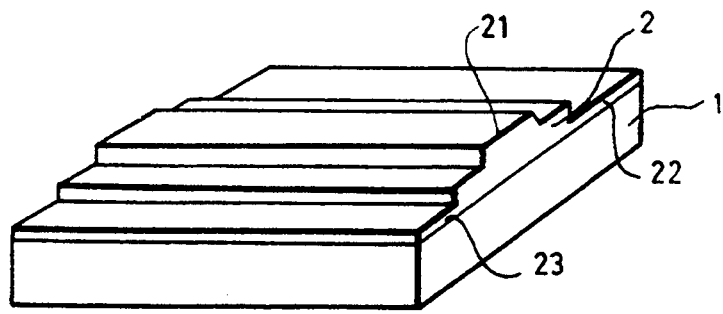
FIGS. 8a to 8e show a general method of manufacture according to the invention.

On an initial substrate 1 made of silicon (100), a thin layer 2 of GaAs (typically 0.5 to 1 $\mu$m) is made. This layer 2 has a central part 21 with two thinned sides 22 and 23, one on each side. This thinned part, as is shown in FIG. 8a, may have different thicknesses so as to have a gradual reduction (for example a stepped reduction) of the layer on each side of the central part 21.

The use of a wafer slightly disoriented towards the direction <110> is not necessarily required, for the anti-phase domain boundary type defects will also be blocked. This preliminary operation of heteroepitaxy may be done by MBE (Molecular Beam Epitaxy), MOCVD (Metalorganic Chemical Vapor Deposition), MOMBE (Metalorganic Molecular Beam Epitaxy), CBE (Chemical Beam Epitaxy) etc.

It is known (see, for example, the review article by H. Kroemer in Fan and Poate ed, *Heteroepitaxy on Silicon*, MRS Symposia Proceedings, No. 67, Pittsburgh Pa., 1986) that the layers of GaAs made by methods such as those referred to here above contain, in the optimum cases, about $10^6$ dislocations per cm$^2$. They can also contain microtwins and anti-phase domain boundaries depending on the conditions of growth. It is naturally impossible to fabricate lasers and photodiodes in layers comprising a density of defects such as this.

Figure 8B:
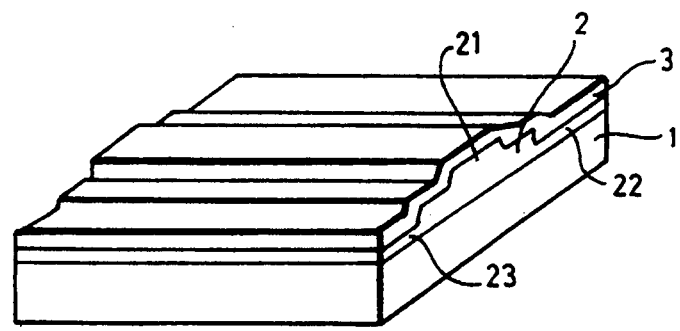

On a layer 2 of GaAs, there is placed a uniform layer 3 of Si$_3$N$_4$ with a typical thickness of the order of 0.3 to 0.9 $\mu$pm (FIG. 8b). Si$_3$N$_4$ has been chosen in this example of manufacture, but it could be any other material in which there can be neither nucleation nor deposition of the material (GaAs in the chosen example) which shall be epitaxiated in the following part of the procedure.

Figure 8C:
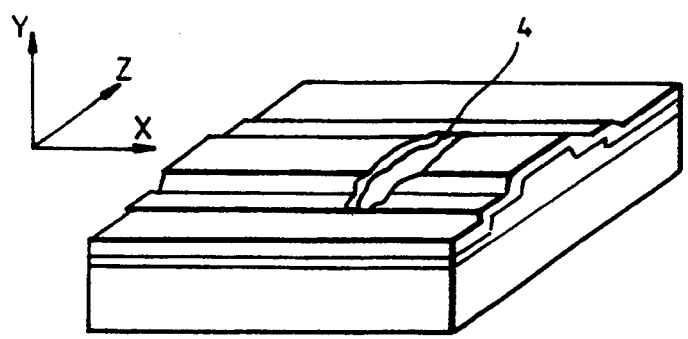

In this layer 3 of Si$_3$N$_4$, at least one aperture 4 (FIG. 8c) is made, reaching at least above the central part of the seed.

Figure 8D:
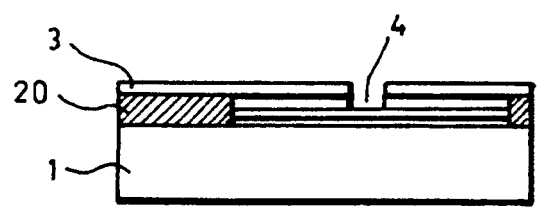

As can be seen in FIG. 8d, an etching is done, through the aperture 4, of the layer 2 so as to keep a seed 20.

Figure 8E:
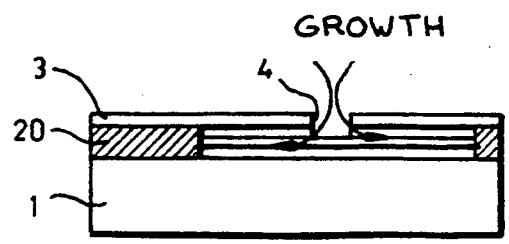

Then a growth (FIG. 8e) is carried out by means of a same material as the one constituting the seed 20, and the growth (in vapor phase) takes place from the seed 20 between the layer 3 and the substrate 1.

The general profile of the cross-section of the seed 20 substantially perpendicular to the direction of growth xx' has a thick part 21 with thinned parts 22, 23 on each side. The growth then takes place generally perpendicularly to the cross-section of the seed.

Figure 9:
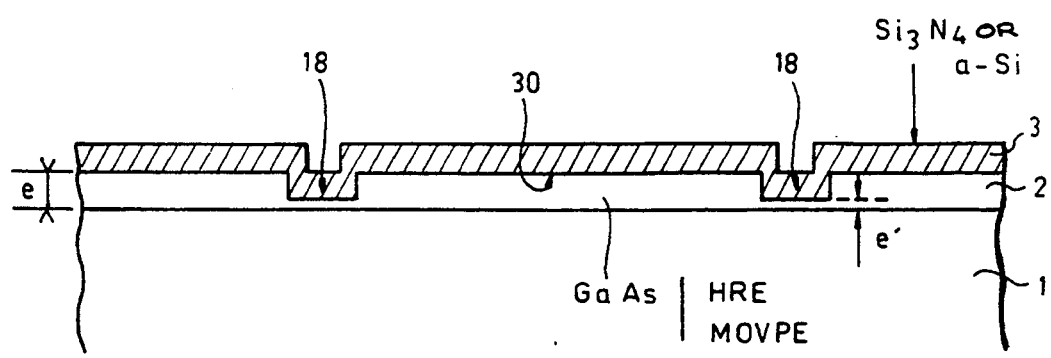
FIGS. 9 and 10 show a more detailed method according to the invention.
Figure 10:
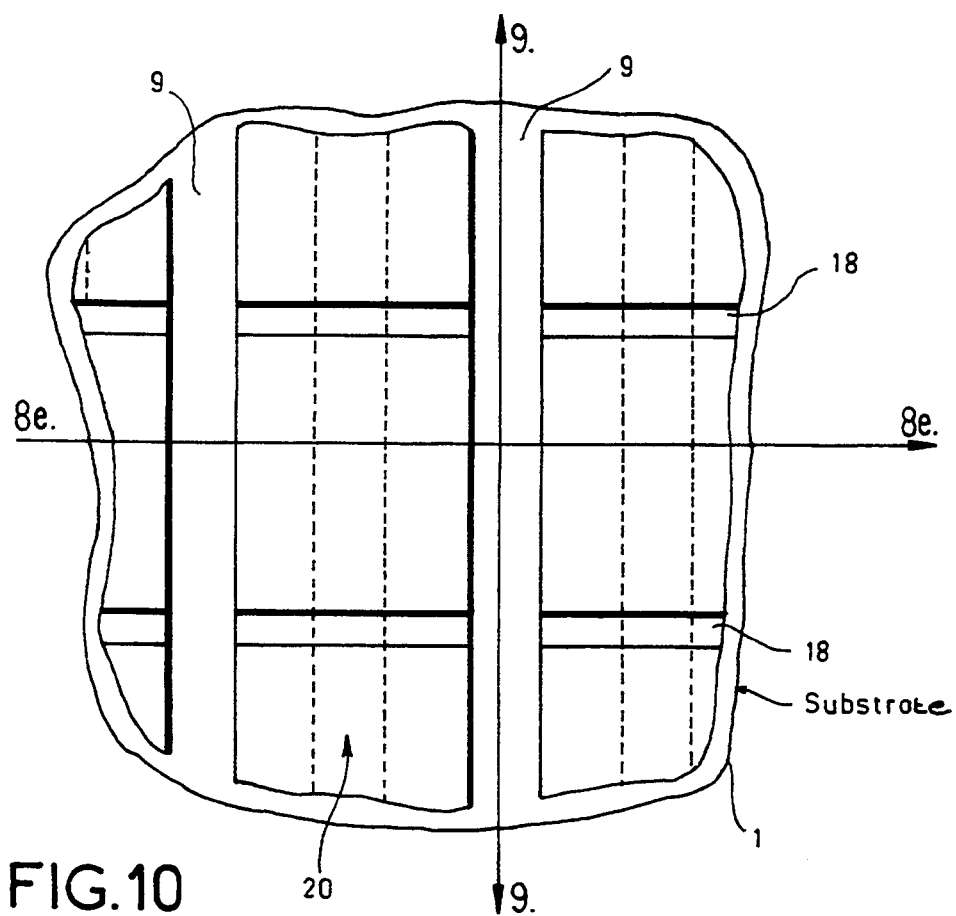

Referring to FIGS. 9 and 10, we shall now describe a detailed example of the method of the invention.

First of all, on a substrate 1 made of a semiconductor material of a first type, a layer 2 of a semiconductor material of a second type is made. For example, the substrate 1 is made of silicon and the layer 2 is made of GaAs.

Then, thinning bands 18 are etched in the layer 2 (GaAs) heteroepitaxially grown on the substrate. These bands do not bare the silicon substrate.

Figure 1:
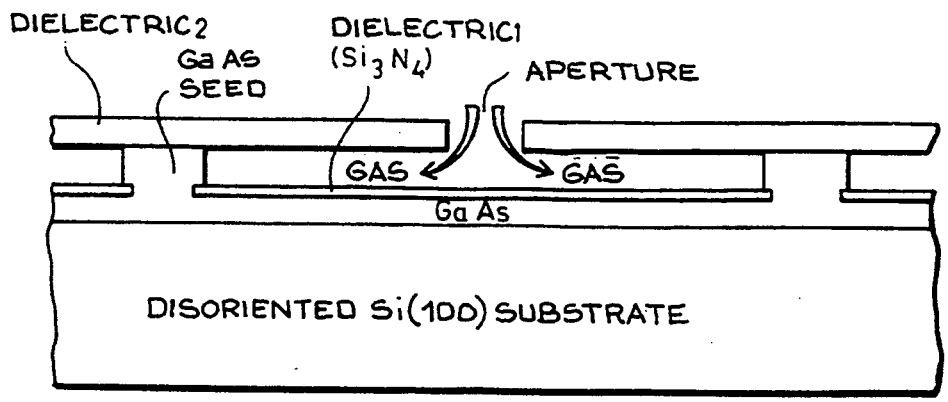
FIGS. 1 to 7 show methods of growth known in the prior art and described here above.
Figure 3:
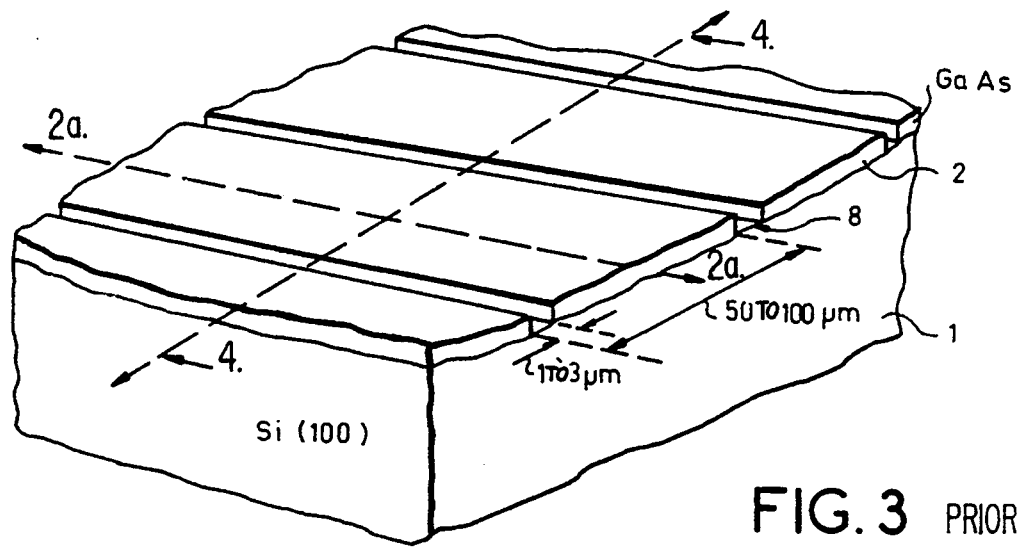
Figure 4:
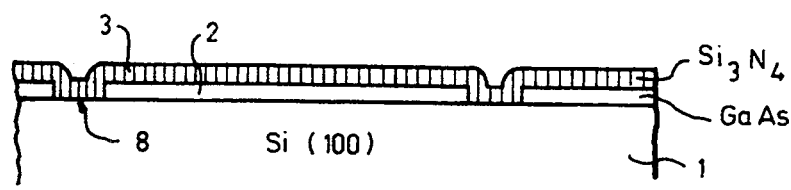
Figure 2A:
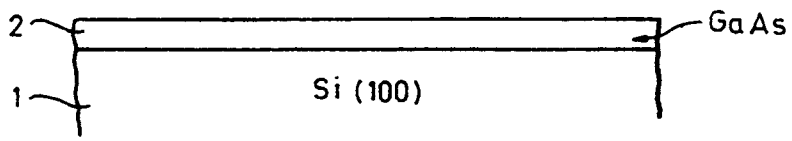
Figure 2B:
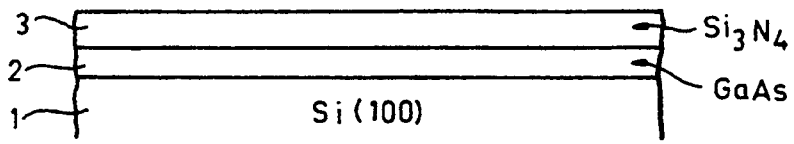
Figure 2C:
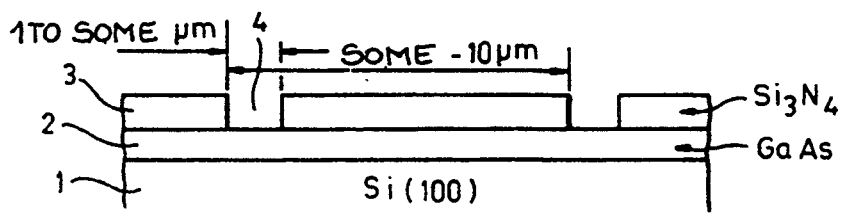
Figure 2D:
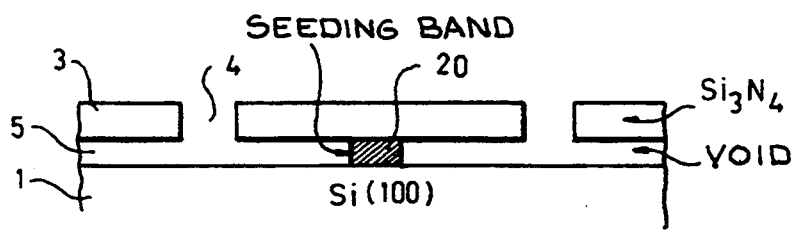
Figure 2E:
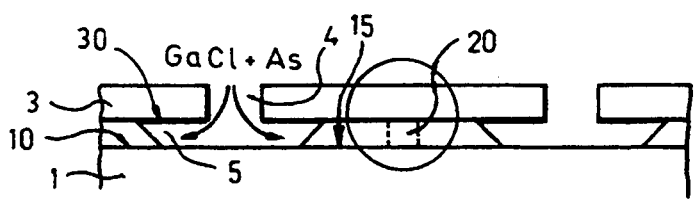
Figure 2F:
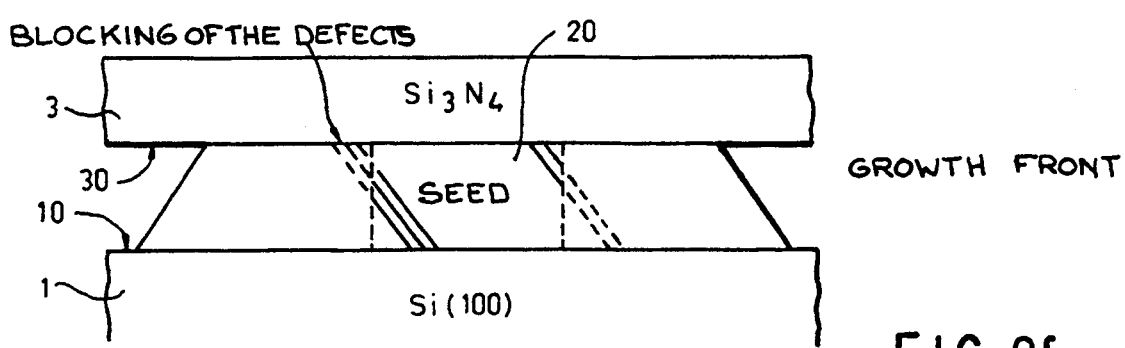
Figure 5:
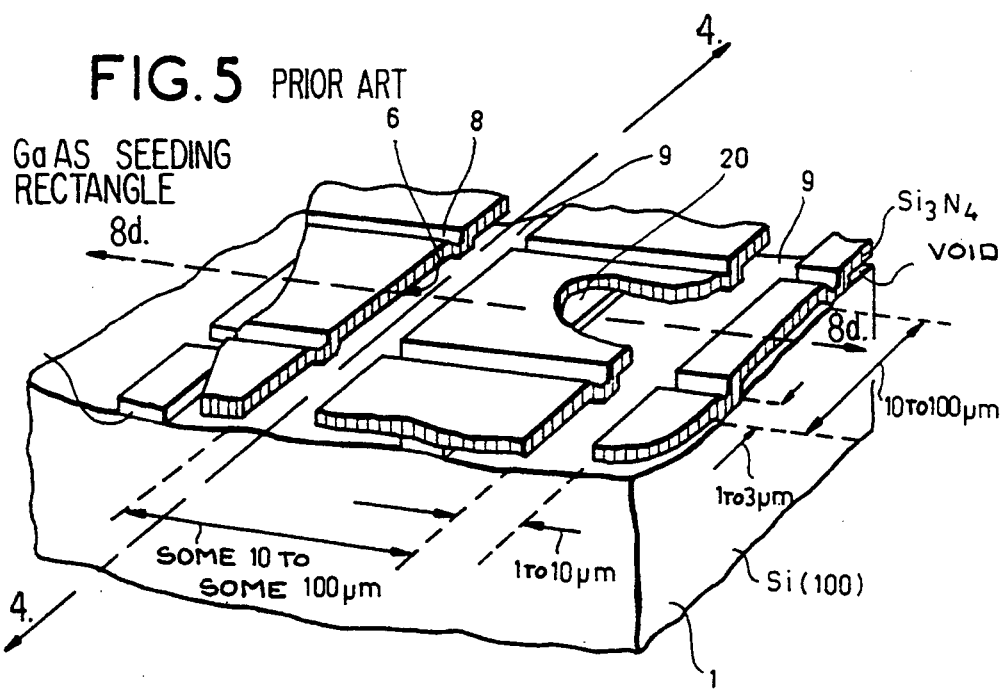
Figure 6:
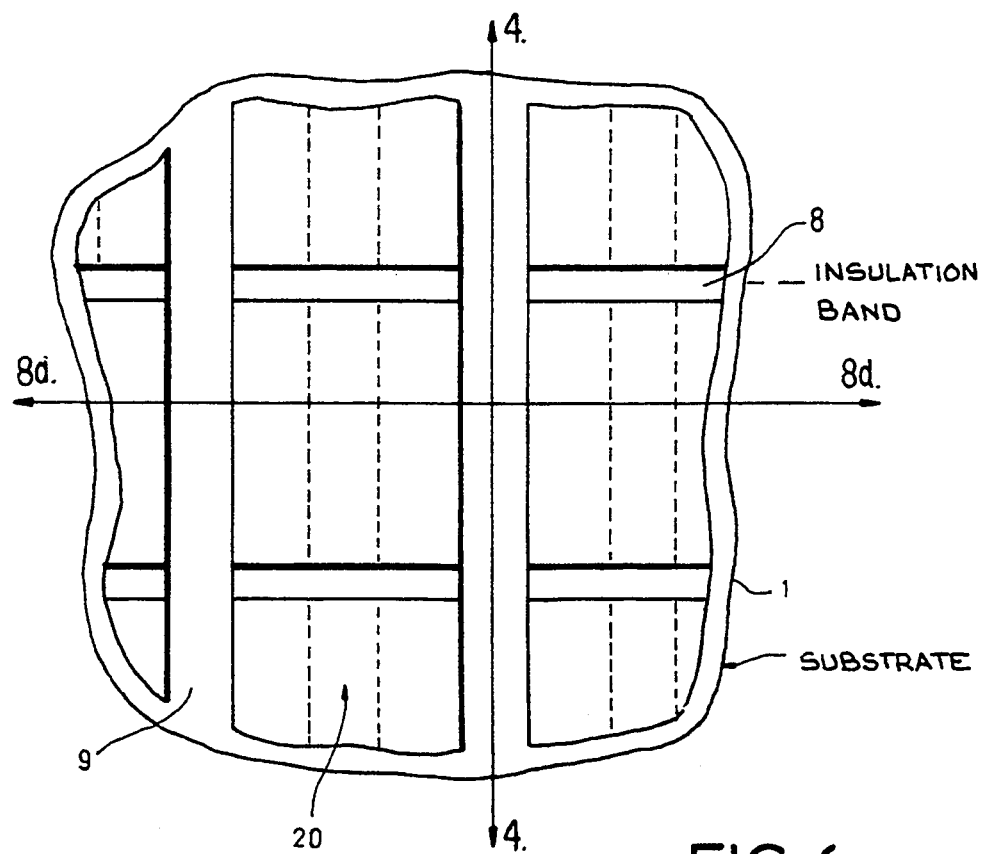

The repetition pitch of these thinning bands is for example 50 to 100 $\mu$m and the width of these bands is typically 1 to some microns. These bands are oriented in a direction <110> or (along xx' in FIG. 3). The thickness e of the layer 2 is, for example, 0.5 to 3 $\mu$m while the thickness e' of the thinning bands 18 is, for example, of the order of 0.05 to 0.2 $\mu$m.

The layer 3 of Si$_3$N$_4$ is then deposited on the previously etched surface. FIG. 9 shows a sectional view along yy' after the deposition of this layer 3 of Si$_3$N$_4$.

The typical thickness of the layer 3 of Si$_3$N$_4$ is 0.5 to 1 $\mu$m.

A second system of bands 9 is then etched in the layer 3 of Si$_3$N$_4$. This system of bands 9 may preferably be perpendicular to the first bands 18, namely perpendicular to the etchings 18 as is shown in FIG. 10.

These bands have a typical width of 1 to 10 $\mu$m, and their repetition pitch ranges from some tens to some hundreds of microns.

The structure obtained is then immersed in a reagent for the chemical etching of the material of the layer 2. For example, a mixture of H$_2$O$_2$ and H$_2$SO$_4$ is appropriate for the selective elimination of a part of the thin layer 2 of heteroepitaxially grown GaAs. However, the etching of the layer 2 is stopped so as to preserve a central part 20 (FIG. 10) which acts as a support for the layer 3 of Si$_3$N$_4$ and will serve as a seed during the operation of growth that will follow.

The result thereof is that, after the chemical etching of the GaAs layer (beneath the layer 3), making possible to go beyond the seeding zones, it is no longer rectangles that are obtained but continuous bands, the thickness of which diminishes periodically.

FIG. 10 shows a top view of the structure after the definition of the seeding bands. In any case, the seeding bands are not discontinuous and, during the directed growth operation, the lateral front of growth is no longer interrupted.

The structure obtained is then introduced into a reactor, for example of the VPE type. The sources it uses are AsCl$_3$ and Ga in the case of GaAs growth. Under normal conditions of deposition, i.e. when the Ga source is maintained at a temperature in the region of 850° C., when the molar fraction of AsCl$_3$ is of the of $10^{-3}$ and when the substrate is maintained at a temperature in the region of 750° C., it is observed that there is nucleation and growth of GaAs on the central seed 20 but, by contrast, neither nucleation nor growth is observed, whether on the exposed surfaces of the layer 3 of Si$_3$N$_4$ or on the substrate 1 of Si (100).

A similar effect of selective growth may be obtained by the use of an MOCVD type reactor with precursors that are no longer of the triethyl or trimethyl gallium form but incorporate chlorides, namely precursors such as diethylgallium chloride ($C_2H_5$) GaCl (see for example the document by Kuech et al, *Proceedings of the 5th International Conference on MOVPE*, Aachen, Germany, 18-22 Jun. 1990).

The growth from the central seed 20 of GaAs takes place between the surface of the Si substrate (100) and the lower surface of the layer 3 of $Si_3N_4$ without there being nucleation, whether on Si or on $Si_3N_4$.

A phenomenon is observed here of blocking of all the defects that are not strictly parallel to the GaAs/$Si_3N_4$ interfaces (dislocations, microtwins and anti-phase domain boundaries). This blocking takes place either on the lower face 30 of the layer 3 (FIG. 9) or on the surface of the substrate 1 made of Si (100). Once the defects have been blocked, the growth occurs normally on each side of the central seed 20, the crystal obtained being then a crystal of excellent quality.

In a following step, the layer 3 is then removed and GaAs semiconductor elements are obtained in the form of thin layers on a silicon substrate.

A variant of the technique consists in the direct introduction, into the epitaxy reactor, of the structure after the making of the etchings 9. The etching of the GaAs layer 2 through the apertures of the etchings 9 made in the layer 3 of $Si_3N_4$ is then done in situ, by hydrochloric acid HCl, either generated by the decomposition of $AsCl_3$ in the case of a trichloride reactor (it is then necessary to have available an additional line of $AsCl_3$ that does not go through the Ga load) or directly injected from a cylinder in the case of an MOCVD reactor.

Then after forced growth and removal of the layer 3, blocks of GaAs without defects are obtained except in the central seeding zone 20 (FIG. 10). The seed 20 and the band of defects may be removed by etching.

It is also possible, before the removal of the layer 3, to make an etching of bands in the layer 3 along a direction yy', so as to make an aperture above each seed 20.

Then, a chemical etching operation is carried out on the seeds 20 and the defective semiconductor parts. Then an epitaxy of the same material (GaAs) is carried out. The $Si_3N_4$ layer is removed, and blocks of semiconductor material without defects are obtained.

It is then possible, if necessary, to carry out a growth of semiconductor material (GaAs) on the blocks so as to join two blocks together.

Figure 7:
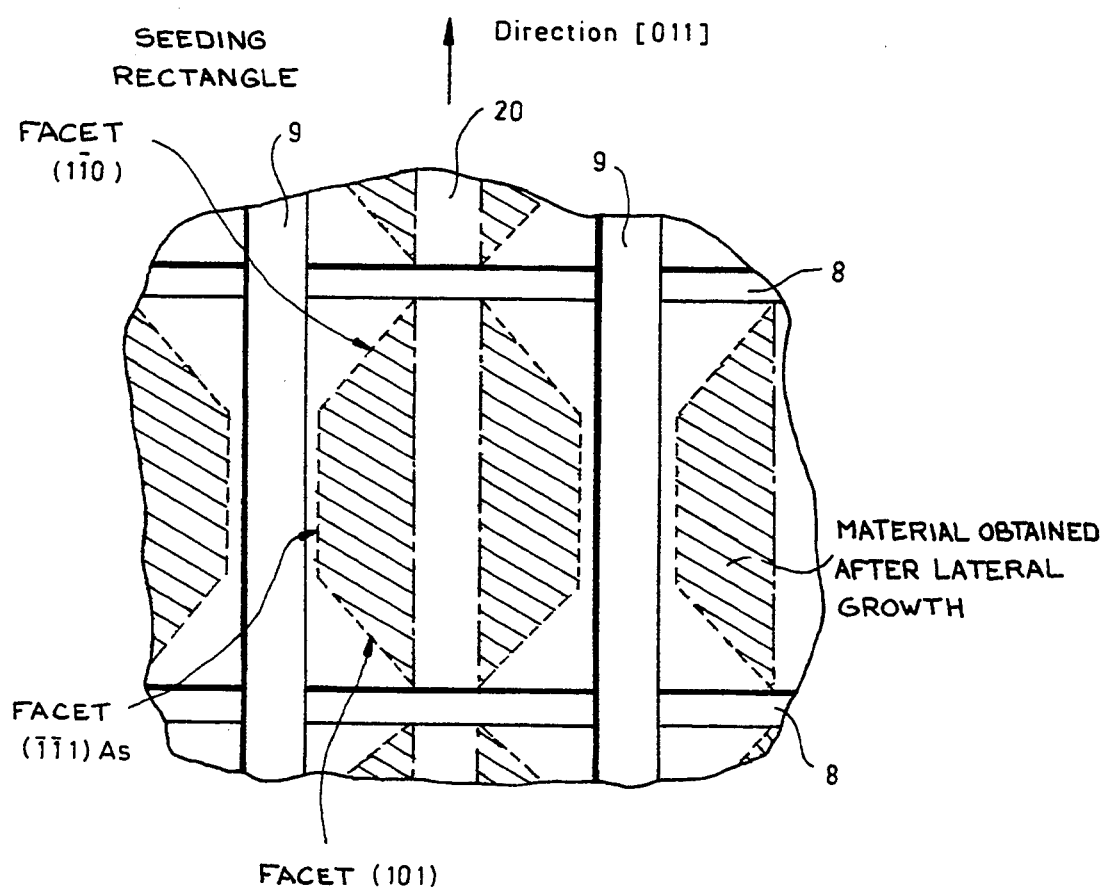

As seen here above, the growth of GaAs between the layer 3 and the substrate 1 is done from a seed that has thinned features but is not interrupted. The growth front is therefore no longer interrupted, the effect of which is to eliminate the earlier observed facetting as described with reference to FIG. 7. Furthermore, since the thickness of the seed 20 is locally smaller, and is smaller periodically, the contraction strains (due to the difference between the coefficients of expansion of GaAs and of the substrate) will be localized in the regions of small thickness which are the most brittle regions. Similarly, if cracks appear, they will be thus localized in these same regions of small thickness if the period of the regions in question is appropriate.

Figure 11A:
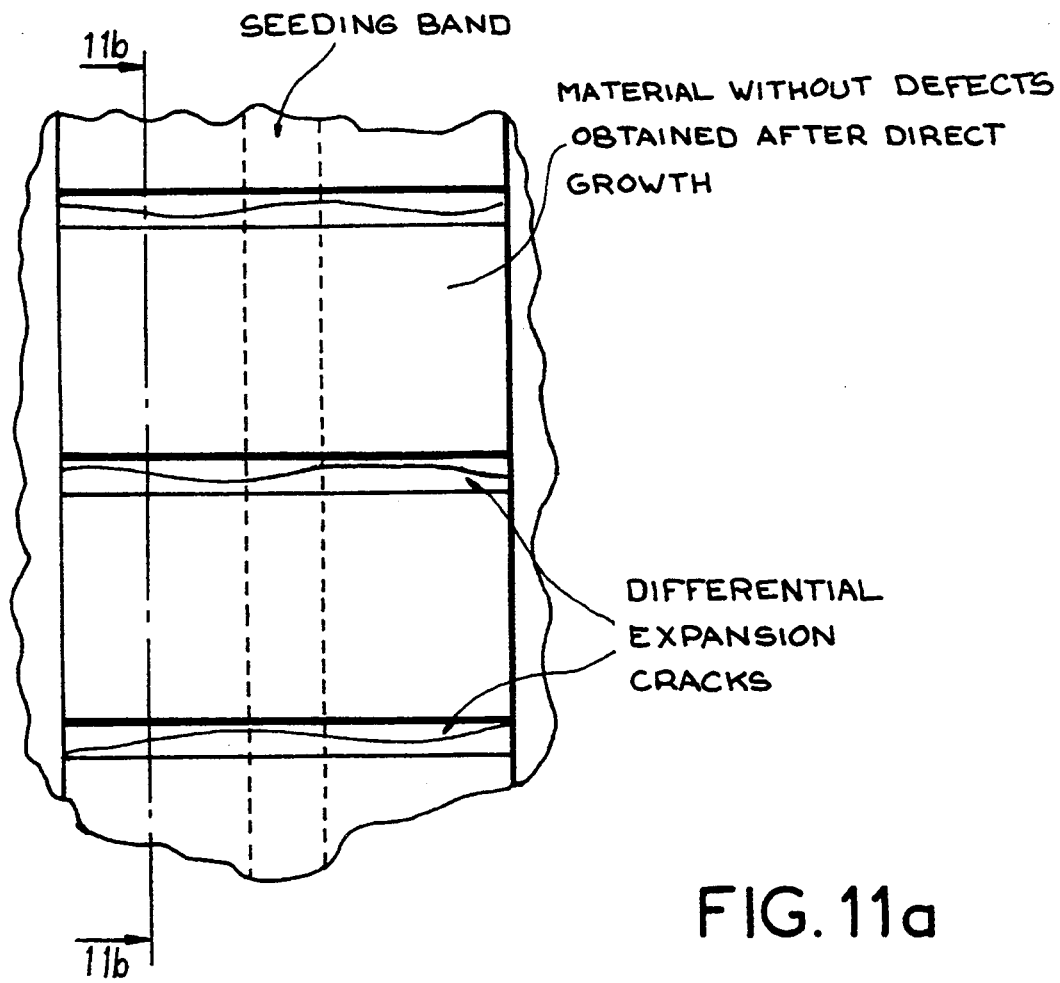
FIGS. 11a and 11b show a device obtained by the method according to the invention.
Figure 11B:
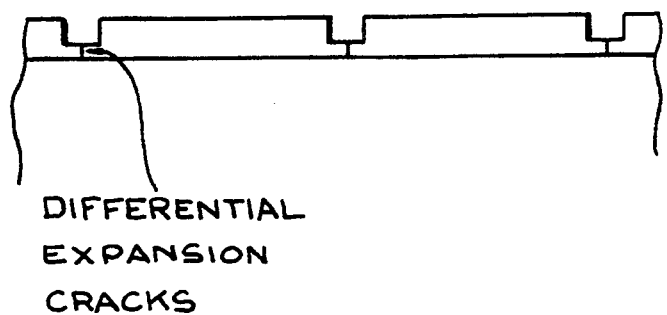

In short, the invention can be used to localize the zones that are defective after growth. FIGS. 11a and 11b summarize this situation after the elimination of the encapsulation layer.

It is clear that the above description has been given purely by way of a non-restrictive example. Other variants may be contemplated without going beyond the scope of the invention. The numerical values have been given solely in order to illustrate the description. Furthermore, as has already been mentioned, the application of the invention to a structure based on semiconductors as indicated in the description has been given purely by way of an example, and materials other than silicon or GaAs could also be used. In this case, the chemical solution used for the partial elimination of the layer 2 should be matched to the material of this layer 2. Furthermore, the methods of etching and growth may be different from those indicated here above.

What is claimed is:

1. A method for the manufacture of a monocrystalline layer made of a second semiconductor material, on a substrate having a growth face and a non-growth face and made of a first semiconductor material, comprising the steps of:

initiating growth by vapor phase deposition on at least one seed of a chemical composition that is identical to the second semiconductor material of the layer to be obtained, confining the growth in a space defined by the growth face of the substrate and a confinement layer that opposes the growth face and that is made of a material that is different from the second semiconductor material in such a way that there can be neither nucleation nor deposition of the second semiconductor material whether on this confinement layer or on said growth face of the substrate;

wherein a cross-section in a plane that is substantially parallel to the growth direction of the seed has a profile along a direction that is perpendicular to the growth direction that comprises a thick central part that is between two thinned lateral parts; and wherein the region between the substrate and the confinement layer has a cross-section with the same profile as the cross-section of the seed.

2. A manufacturing method according to claim 1, wherein the seed is included in the confinement space.

3. A method for the growth of heteroepitaxial layers, comprising the following steps:

a) a first step of making, on a monocrystalline semiconductor substrate comprising a first semiconductor material and having a growth surface and a non-growth surface, a first layer of a second semiconductor material;

b) a second step of etching, in the first layer, which has a first thickness, bands constituting thinning features in the first layer, which are thinner than the first thickness;

c) a third step of making, on the first layer, a second layer that is made of a material such that there can be neither nucleation nor deposition onto the second layer, of the second semiconductor material;

d) a fourth step of etching, in the second layer, at least one first aperture reaching the first layer;

e) a fifth step of chemical etching, from said aperture, some of the first layer of semiconductor material so as to leave at least one seed of the second semiconductor material between the second layer and the substrate, thereby forming a confinement space;

f) a sixth step of growing along a first growth direction, by vapor phase epitaxy, monocrystalline second semiconductor material in the confinement space.

4. A method according to claim 3, comprising a seventh step for the removal of the confinement layer.

5. A method according to claim 3, wherein the sixth step of growth by vapor phase epitaxy is followed by a step of etching at least one second aperture in the second layer at a position located above the seed, and then chemically etching through the second aperture, parts of the second embodiment material that are located on each side of the seed.

6. A method according to claim 5 further comprising the step of vapor phase epitaxy of second semiconductor material through the second aperture.

7. A method according to claim 6, further comprising the steps of removing the second layer which is then followed by a step of vapor phase epitaxy.

8. A method according to claim 3, wherein the first aperture made during the fourth step of etching is elongated along a first elongation direction, the bands constituting the thinning features are elongated along a second elongation direction, and the first and second elongation directions are not parallel to one another.

9. A method according to claim 8, wherein the first elongation direction is perpendicular to the bands constituting thinning features in the first layer.

10. A method for growing heteroepitaxial semiconductor layers, comprising the steps of:

growing a first layer of a first semiconductor material on a surface of a substrate comprising a second semiconductor material;

etching bands that are thinner than thicker regions of the first layer in the first layer;

depositing a confinement layer onto the first layer, wherein the confinement layer comprises a material on which there can be neither nucleation or deposition by vapor phase growth under any of the conditions in which nucleation or deposition of the first semiconductor material onto a surface of the first semiconductor material does occur;

etching at least one aperture into the second layer which reaches through the second layer to a portion of the first layer;

chemically etching thinner and thicker regions of the first layer, from the portion of the first layer that is exposed through the aperture, thereby leaving a recessed seed crystal of the first semiconductor material in a confinement space that is between the surface of the substrate and the second layer;

growing monocrystal of the first semiconductor material in the confinement space by vapor phase epitaxy onto the recessed seed crystal.

* * * * *

UNITED STATES PATENT AND TRADEMARK OFFICE
CERTIFICATE OF CORRECTION

PATENT NO. : 5,356,510
DATED : October 18, 1994
INVENTOR(S) : Didier Pribat et al.

It is certified that error appears in the above-indentified patent and that said Letters Patent is hereby corrected as shown below:

On the title page, Item [75],

The first inventor's first name is incorrect, should read:

--Didier--

Signed and Sealed this

Ninth Day of May, 1995

Attest:

BRUCE LEHMAN

Attesting Officer       Commissioner of Patents and Trademarks